United States Patent
Liu

(10) Patent No.: US 12,507,478 B2
(45) Date of Patent: Dec. 23, 2025

(54) ARRAY SUBSTRATE, METHOD FOR FABRICATING SAME, AND DISPLAY PANEL

(71) Applicant: TCL CHINA STAR OPTOELECTRONICS TECHNOLOGY CO., LTD., Guangdong (CN)

(72) Inventor: Jing Liu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 528 days.

(21) Appl. No.: 17/607,876

(22) PCT Filed: Sep. 23, 2021

(86) PCT No.: PCT/CN2021/119797
§ 371 (c)(1),
(2) Date: Oct. 30, 2021

(87) PCT Pub. No.: WO2023/035324
PCT Pub. Date: Mar. 16, 2023

(65) Prior Publication Data
US 2024/0030229 A1    Jan. 25, 2024

(30) Foreign Application Priority Data
Sep. 9, 2021    (CN) .......................... 202111056960.6

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0231* (2025.01); *H10D 86/441* (2025.01)

(58) Field of Classification Search
CPC ... H01L 27/12; H01L 27/1259; H01L 27/124; H01L 27/1288; H01L 29/41733;
(Continued)

(56) References Cited

U.S. PATENT DOCUMENTS 8,183,070 B2 * 5/2012 Kim .................... H01L 27/1288
438/149
2003/0107023 A1 * 6/2003 Chae .................... H01L 29/458
257/E21.309
(Continued)

FOREIGN PATENT DOCUMENTS

| CN | 101435965 A | 5/2009 |
| CN | 102347274 A | 2/2012 |

(Continued)

OTHER PUBLICATIONS

Chinese Office Action issued in corresponding Chinese Patent Application No. 202111056960.6 dated May 13, 2022, pp. 1-11.
(Continued)

*Primary Examiner* — Shaun M Campbell
(74) *Attorney, Agent, or Firm* — PV IP PC; Christopher S. Ruprecht; Wei Te Chung

(57) ABSTRACT

An array substrate, a method for fabricating the same, and a display panel are disclosed. The array substrate includes a base, an active layer, a source electrode, and a drain electrode that are sequentially disposed. The active layer includes a channel region. The source electrode and the drain electrode are located at opposing sides of the channel region. The source electrode and the drain electrode both include a metal barrier layer and a conductive metal layer that are sequentially disposed at an end of the source electrode away from the channel region and/or the drain electrode away from the channel region. The metal barrier layer includes a first protrusion, and the first protrusion
(Continued)

extends from an end portion of the conductive metal layer in a direction away from the channel region.

17 Claims, 8 Drawing Sheets

(58) Field of Classification Search
CPC ......... H01L 29/66765; H01L 29/78669; H01L 29/41758
See application file for complete search history.

(56) References Cited

U.S. PATENT DOCUMENTS

| | | |
|---|---|---|
| 2010/0210056 A1 | 8/2010 | Seo et al. |
| 2011/0133193 A1* | 6/2011 | Song ................ H01L 29/78669 257/E21.414 |
| 2017/0256620 A1* | 9/2017 | Lin .................... H01L 29/41775 |
| 2019/0280016 A1* | 9/2019 | Cho .................... H01L 27/1222 |
| 2020/0135767 A1* | 4/2020 | Ge .................... H01L 29/66765 |

FOREIGN PATENT DOCUMENTS

| | | |
|---|---|---|
| CN | 107154403 A | 9/2017 |
| CN | 107591415 A | 1/2018 |
| CN | 108417583 A | 8/2018 |
| CN | 112071867 A | 12/2020 |

OTHER PUBLICATIONS

International Search Report in International application No. PCT/CN2021/119797, mailed on Apr. 26, 2022.
Written Opinion of the International Searching Authority in International application No. PCT/CN2021/119797, mailed on Apr. 26, 2022.
Notification to Grant Patent Right for Invention issued in corresponding Chinese Patent Application No. 202111056960.6 dated Jul. 20, 2022, pp. 1-4.

* cited by examiner

ARRAY SUBSTRATE, METHOD FOR FABRICATING SAME, AND DISPLAY PANEL

RELATED APPLICATIONS

This application is a Notional Phase of PCT Patent Application No. PCT/CN2021/119797 having international filing date of Sep. 23, 2021, which claims the benefit of priority of Chinese Patent Application No. 202111056960.6 filed on Sep. 9, 2021. The contents of the above applications are all incorporated by reference as if fully set forth herein in their entirety.

BACKGROUND OF INVENTION

1. Field of Invention

The present application relates to a technical field of displays, and particularly to an array substrate, a method for fabricating same, and a display panel.

2. Related Art

With rapid development of liquid crystal display technologies, manufacturing processes of array substrates have also developed quickly. Comparing to 5 mask manufacturing process of conventional array substrates, current array substrates are mainly fabricated by using 4 masks (4Mask) to achieve the purpose of cost saving.

In the 4Mask process, since active layers, source electrodes, and drain electrodes are fabricated through same photomasks, a situation that a length of outward protrusions of active layers is greater comparing to the source electrodes and the drain electrodes disposed on the active layers is inevitable during fabricating the active layers. Specifically, the outward protrusions of the active layers comparing to the source electrodes and drain electrodes are referred to as amorphous silicon tails (AS tail). When the AS tails are too long, they will adversely affect stability of driving signals of the array substrates.

SUMMARY OF INVENTION

The embodiments of the present application provide an array substrate, a method for fabricating the same and a display panel, so as to reduce the length of the AS Tail.

An embodiment of the application provides an array substrate, comprising a base; an active layer disposed on the base and comprising a channel region; a source electrode disposed on the active layer; and a drain electrode disposed on the active layer, wherein the source electrode and the drain electrode are located at two opposing sides of the channel region, and each of the source electrode and the drain electrode comprises a metal barrier layer and a conductive metal layer that are sequentially disposed on the active layer; wherein at an end of the source electrode away from the channel region and/or at an end of the drain electrode away from the channel region, the metal barrier layer comprises a first protrusion, and the first protrusion extends from an end portion of the conductive metal layer toward a direction away from the channel region.

Optionally, in some embodiments of the present application, a length of the first protrusion is between 0.05 (microns) μm and 1.5 μm in a direction from the channel region toward the source electrode and/or the drain electrode.

Optionally, in some embodiments of the present application, the length of the first protrusion is between 1.0 μm and 1.5 μm.

Optionally, in some embodiments of the present application, the active layer comprises a second protrusion, and the second protrusion extends from an end portion of the first protrusion toward a direction away from the channel region.

Optionally, in some embodiments of the present application, the active layer comprises an amorphous silicon layer and an ohmic contact layer, the ohmic contact layer is located on a side of the amorphous silicon layer near the metal barrier layer, the second protrusion comprises a first sub-protrusion and a second sub-protrusion, the first sub-protrusion is located in the amorphous silicon layer, and the second sub-protrusion is located in the ohmic contact layer; wherein at the end of the source electrode away from the channel region and/or at the end of the drain electrode away from the channel region, each of the first sub-protrusion and the second sub-protrusion extends from an end portion of the first protrusion toward the direction away from the channel region.

Optionally, in some embodiments of the present application, the active layer comprises an amorphous silicon layer and an ohmic contact layer, the ohmic contact layer is located on a side of the amorphous silicon layer near the metal barrier layer, the second protrusion is located in the amorphous silicon layer; wherein at the end of the source electrode away from the channel region and/or at the end of the drain electrode away from the channel region, a sidewall of the ohmic contact layer is flush with a sidewall of the first protrusion.

Optionally, in some embodiments of the present application, a length of the second protrusion is between 0 μm and 2 μm in a direction from the channel region toward the source electrode and/or the drain electrode.

Optionally, in some embodiments of the present application, a material of the metal barrier layer comprises at least one of molybdenum or a molybdenum alloy, and a material of the conductive metal layer comprises copper.

The embodiments of the present application provide a display panel comprising an array substrate, and the array substrate comprising: a base; an active layer disposed on the base and comprising a channel region; a source electrode disposed on the active layer; and a drain electrode disposed on the active layer, wherein the source electrode and the drain electrode are located at two opposing sides of the channel region, and each of the source electrode and the drain electrode comprises a metal barrier layer and a conductive metal layer that are sequentially disposed on the active layer; wherein at an end of the source electrode away from the channel region and/or at an end of the drain electrode away from the channel region, the metal barrier layer comprises a first protrusion, and the first protrusion extends from an end portion of the conductive metal layer toward a direction away from the channel region.

Optionally, in some embodiments of the present application, a length of the first protrusion is between 0.05 μm and 1.5 μm in a direction from the channel region toward the source electrode and/or the drain electrode.

Optionally, in some embodiments of the present application, the length of the first protrusion is between 1.0 μm and 1.5 μm.

Optionally, in some embodiments of the present application, the active layer comprises a second protrusion, and the second protrusion extends from an end portion of the first protrusion toward a direction away from the channel region.

Optionally, in some embodiments of the present application, the active layer comprises an amorphous silicon layer and an ohmic contact layer, the ohmic contact layer is located on a side of the amorphous silicon layer near the metal barrier layer, the second protrusion comprises a first sub-protrusion and a second sub-protrusion, the first sub-protrusion is located in the amorphous silicon layer, and the second sub-protrusion is located in the ohmic contact layer; wherein at the end of the source electrode away from the channel region and/or at the end of the drain electrode away from the channel region, each of the first sub-protrusion and the second sub-protrusion extends from the end portion of the first protrusion toward the direction away from the channel region.

Optionally, in some embodiments of the present application, the active layer comprises an amorphous silicon layer and an ohmic contact layer, the ohmic contact layer is located on a side of the amorphous silicon layer near the metal barrier layer, the second protrusion is located in the amorphous silicon layer; at the end of the source electrode away from the channel region and/or at the end of the drain electrode away from the channel region, a sidewall of the ohmic contact layer is flush with a sidewall of the first protrusion.

Optionally, in some embodiments of the present application, a length of the second protrusion is between 0 μm and 2 μm in a direction from the channel region toward the source electrode and/or the drain electrode.

Optionally, in some embodiments of the present application, a material of the metal barrier layer comprises at least one of molybdenum or a molybdenum alloy, and a material of the conductive metal layer comprises copper.

The embodiments of the present application provide a method for fabricating an array substrate, comprising providing a base; sequentially forming an active base layer, a first metal base layer, and a second metal base layer; etching the first metal base layer and the second metal base layer to respectively form a first metal layer and a second metal layer, wherein the first metal layer and the second metal layer configure a source/drain electrode pattern; etching the active base layer to form an active layer pattern; etching the first metal layer and the second metal layer by using an etching solution to respectively form a metal barrier layer and a conductive metal layer, wherein the source/drain electrode pattern is turned into a source electrode and a drain electrode, an etching rate of the first metal layer in the etching solution is less than an etching rate of the second metal layer in the etching solution; etching the active layer pattern to form an active layer; wherein at an end of the source electrode away from a channel region of the active layer and/or at an end of the drain electrode away from the channel region of the active layer, the metal barrier layer comprises a first protrusion, and the first protrusion extends from an end portion of the conductive metal layer toward a direction away from the channel region.

Optionally, in some embodiments of the present application, in the step of etching the first metal layer and the second metal layer by using the etching solution to respectively form the metal barrier layer and the conductive metal layer, the etching solution comprises an acidic oxidant and a metal etchant, a mass content of the acidic oxidant in the etching solution is between 5% and 6%, and a mass content of the metal etchant in the etching solution is between 0.01% and 0.05%.

Optionally, in some embodiments of the present application, the active base layer comprises an amorphous silicon base layer and an ohmic contact base layer that are sequentially formed, the active layer pattern comprises an amorphous silicon layer and an ohmic contact pattern, and the step of etching the active layer pattern comprises: etching the ohmic contact pattern to form an ohmic contact layer, wherein the amorphous silicon layer and the ohmic contact layer configure the active layer, the amorphous silicon layer comprises a first sub-protrusion, and the ohmic contact layer comprises a second sub-protrusion; at the end of the source electrode away from the channel region and/or at the end of the drain electrode away from the channel region, each of the first sub-protrusion and the second sub-protrusion extends from an end portion of the first protrusion toward a direction away from the channel region.

Optionally, in some embodiments of the present application, a material of the first metal layer comprises at least one of molybdenum or a molybdenum alloy, a material of the conductive metal layer comprises copper, the acidic oxidant is hydrogen peroxide, and the metal etchant is a molybdenum etchant.

The present application has advantageous effects as follows: comparing to a conventional array substrate in the prior art, both the source electrode and the drain electrode of the array substrate provided by the present application comprise the metal barrier layer and the conductive metal layer that are sequentially disposed on the active layer. The present application makes the metal barrier layer have the first protrusion at the end of the source electrode away from the channel region and/or at the end of the drain electrode away from the channel region, and the first protrusion extends from an end portion of the conductive metal layer toward a direction away from the channel region. Because the first protrusion is disposed on the active layer, the presence of the first protrusion can cover a portion of the active layer so as a length of outward protrusion of the active layer comparing to the metal barrier layer is reduced. That is, the length of outward protrusion of the active layer comparing to the source electrode and/or the drain electrode is reduced. As a result, stability of a driving signal of the array substrate is improved.

BRIEF DESCRIPTION OF DRAWINGS

In order to describe the technical solutions more clearly in the embodiments of the present application, the following will briefly introduce the drawings used in the description of the embodiments. The drawings in the following description are only some embodiments of the present application. As far as technical personnel are concerned, they can obtain other drawings based on these drawings without creative work.

DESCRIPTION OF PREFERRED EMBODIMENTS

Figure 1:
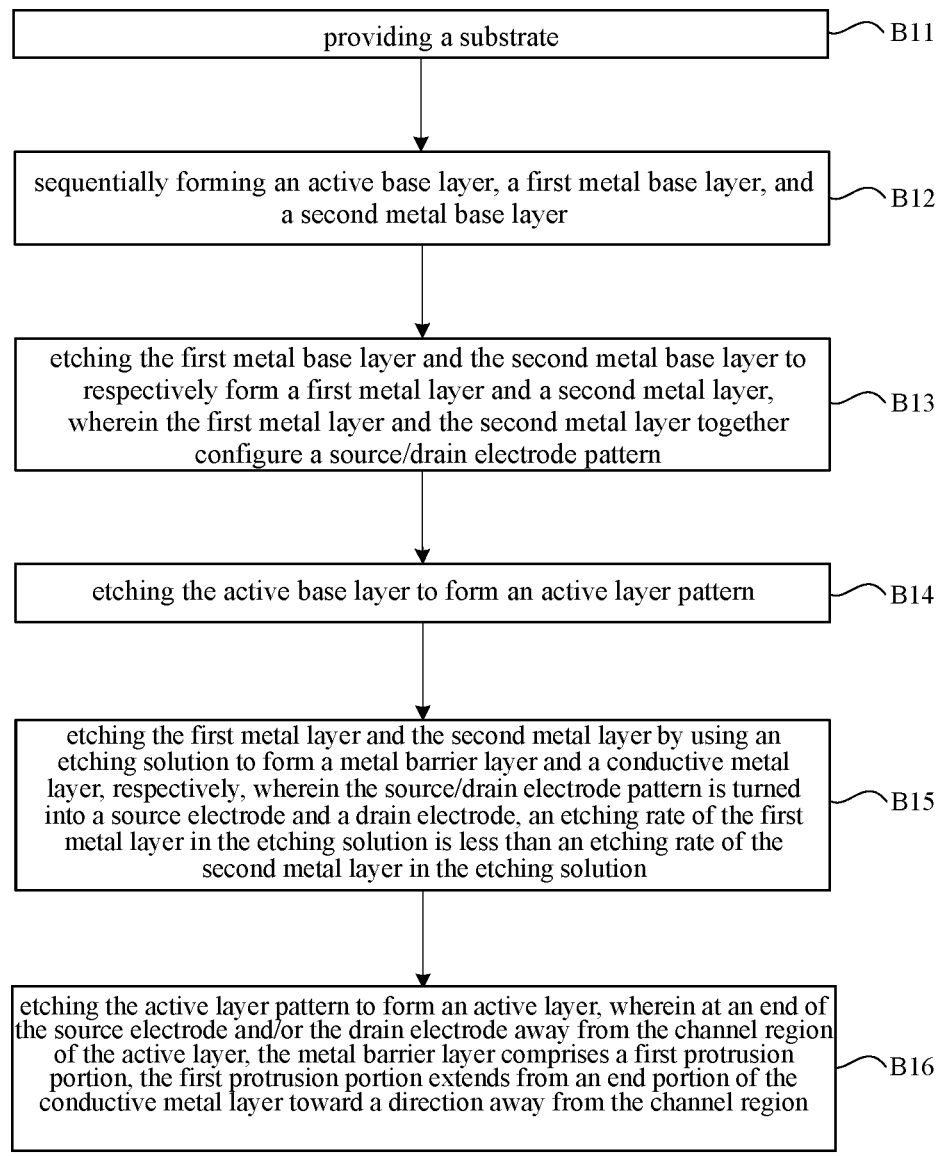
FIG. 1 is a flowchart of a method for fabricating an array substrate provided by a first embodiment of the present application.

The technical solutions in the embodiments of the present application will be clearly and completely described below in conjunction with the accompanying drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application, and are not used to limit the application. In this application, unless otherwise stated, the directional words used such as "upper" and "lower" generally refer to the upper and lower directions of the device in actual use or working state, and specifically refer to the drawing directions in the drawings; and "inner" and "outer" refer to the outline of the device.

The present application discloses an array substrate, a method for fabricating the same, and a display panel. Detailed descriptions are given below. It should be noted that the order of description in the following embodiments is not meant to limit the preferred order of the embodiments.

Referring to FIG. 1, a first embodiment of the present application provides a method for fabricating an array substrate including:

B11: providing a base;

B12: sequentially forming an active base layer, a first metal base layer, and a second metal base layer;

B13: etching the first metal base layer and the second metal base layer to form a first metal layer and a second metal layer, respectively, wherein the first metal layer and the second metal layer together configure a source/drain electrode pattern;

B14: etching the active base layer to form an active layer pattern;

B15: etching the first metal layer and the second metal layer by using an etching solution to form a metal barrier layer and a conductive metal layer, respectively, wherein the source/drain electrode pattern is turned into a source electrode and a drain electrode, an etching rate of the first metal layer in the etching solution is less than an etching rate of the second metal layer in the etching solution;

B16: etching the active layer pattern to form an active layer, wherein at an end of the source electrode away from a channel region of the active layer and/or the drain electrode away from the channel region of the active layer, the metal barrier layer includes a first protrusion, the first protrusion extends from an end portion of the conductive metal layer toward a direction away from the channel region.

Therefore, in the method for fabricating the array substrate provided by the first embodiment of the present application, by crafting that the etching rate of the first metal layer in the etching solution is less the etching rate of the second metal layer in the etching solution during the etching process of the first metal layer and the second metal layer so that the metal barrier layer formed by etching the first metal layer forms the first protrusion that is more protruding comparing to the conductive metal layer. Because the first protrusion is disposed on the active layer, the formation of the first protrusion may reduce a length of an outward protrusion of the active layer comparing to the metal barrier layer. That is, the length of the outward protrusion of the active layer comparing to the source electrode and/or the drain electrode is reduced. As a result, a difference between parasitic capacitance formed among the gate electrode and the source/drain electrode under light and non-light conditions can be reduced, which is beneficial to improve stability of a driving signal of the array substrate.

The method for fabricating the array substrate provided by the first embodiment of the present application will be described in the following.

It should be noted that the array substrate in this embodiment includes thin film transistors. The thin film transistors can be top-gate structure or bottom-gate structure. This embodiment only uses a bottom-gate thin film transistor as an example but is not limited thereto.

Referring to FIG. 1 and FIG. 2A to FIG. 2H, the method for fabricating the array substrate 100 provided by the first embodiment of the present application includes the following steps:

B11: providing a base 10. The base 10 may be a rigid substrate such as a glass substrate, or the base 10 may also be a flexible substrate such as a polyimide substrate. The material of the base 10 is not specifically limited in the present application. After the step B11, the method further includes: sequentially forming a gate electrode 11 and a gate insulating layer 12 on the base 10, wherein the materials and processes for fabricating the gate electrode 11 and the gate insulating layer 12 can be referred to the prior art, which will not be repeated herein.

Figure 2A:
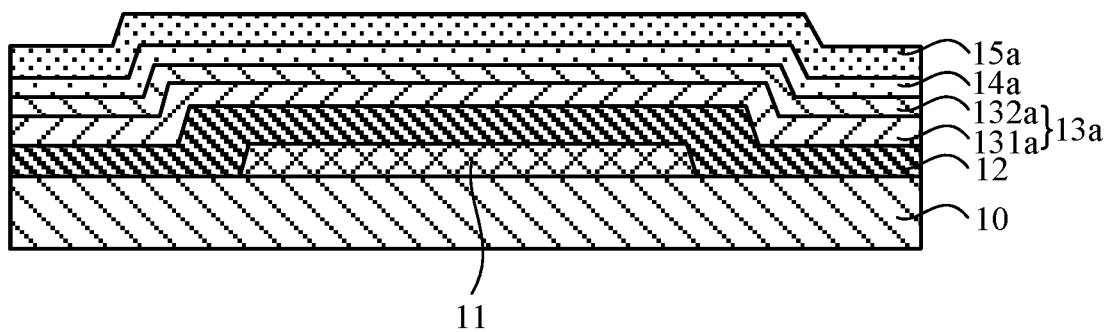
FIGS. 2A to 2H are schematic structural diagrams sequentially obtained at each stage in the method for fabricating the array substrate shown in FIG. 1.

B12: sequentially forming an active base layer 13a, a first metal base layer 14a, and a second metal base layer 15a on the base 10 to form a structure as shown in FIG. 2A.

The step B12 specifically includes the following steps:

B121: sequentially forming an amorphous silicon base layer 131a and an ohmic contact base layer 132a on the base 10, the amorphous silicon base layer 131a and the ohmic contact base layer 132a configure an active base layer 13a; the material of the amorphous silicon base layer 131a may be amorphous silicon. The material of the ohmic contact base layer 132a may be doped amorphous silicon such as N-type or P-type doped amorphous silicon. In the present embodiment, the material of the ohmic contact base layer 132a is N-type doped amorphous silicon.

Wherein, after forming the gate insulating layer 12, the amorphous silicon base layer 131a and the ohmic contact base layer 132a may be sequentially formed using a chemical vapor deposition method.

B122: forming a first metal base layer 14a on the ohmic contact base layer 132a; the material the first metal base layer 14a may be selected from at least one of molybdenum or a molybdenum alloy. Wherein, the molybdenum alloy may be a binary alloy of molybdenum. The binary alloy may comprise one of titanium, chromium, nickel, or aluminum other than molybdenum. The molybdenum alloy may also be a ternary alloy of molybdenum. The ternary alloy may comprise any two of titanium, chromium, nickel, and aluminum other than molybdenum. Wherein, after the formation of the active base layer 13a, the first metal base layer 14a may be formed by sputtering, thermal evaporation, electroplating, and other film forming methods.

B123: forming a second metal base layer 15a on the first metal base layer 14a. The material of the second metal base layer 15a may comprise copper. In some embodiments, the material of the second metal base layer 15a may further comprise one or more of molybdenum, titanium, aluminum, chromium, or nickel.

Specifically, after the formation of the first metal base layer 14a, the second metal base layer 15a can be formed by sputtering, thermal evaporation, electroplating, and other film forming methods.

Figure 2B:
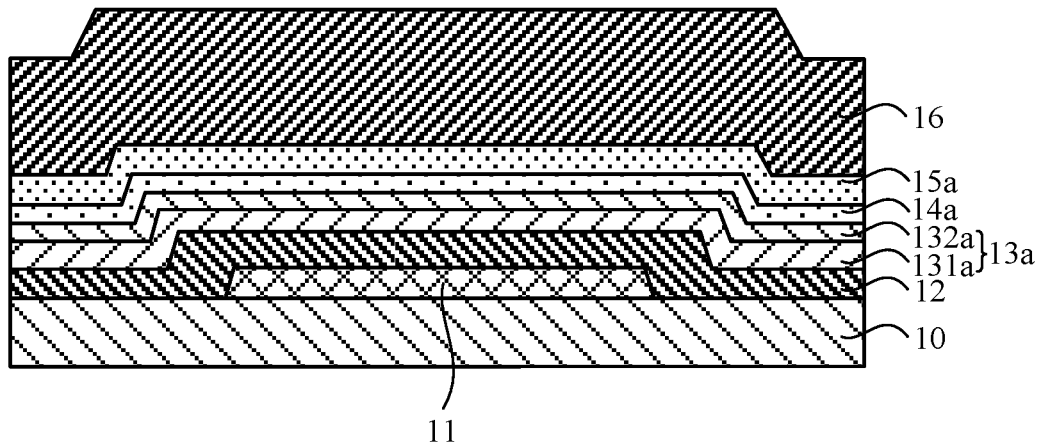
Figure 2C:
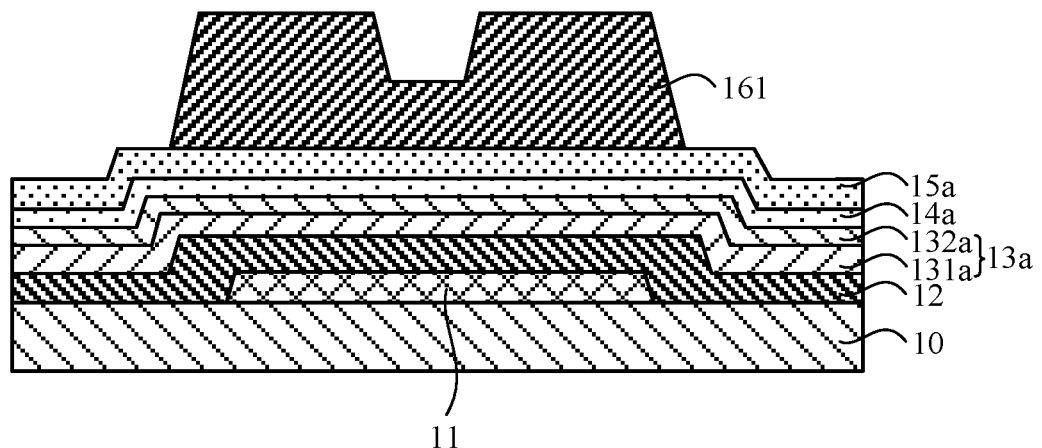

After the step B12, the method further includes the following steps: coating a photoresist layer 16 on the second metal base layer 15a as shown in FIG. 2B; as shown in FIG. 2C, the photoresist layer 16 is exposed and developed using a half-tone mask or a gray tone mask to form a first photoresist pattern 161. The thickness of the two sides of the first photoresist pattern 161 is greater than the thickness of the middle part of the first photoresist pattern 161.

Figure 2D:
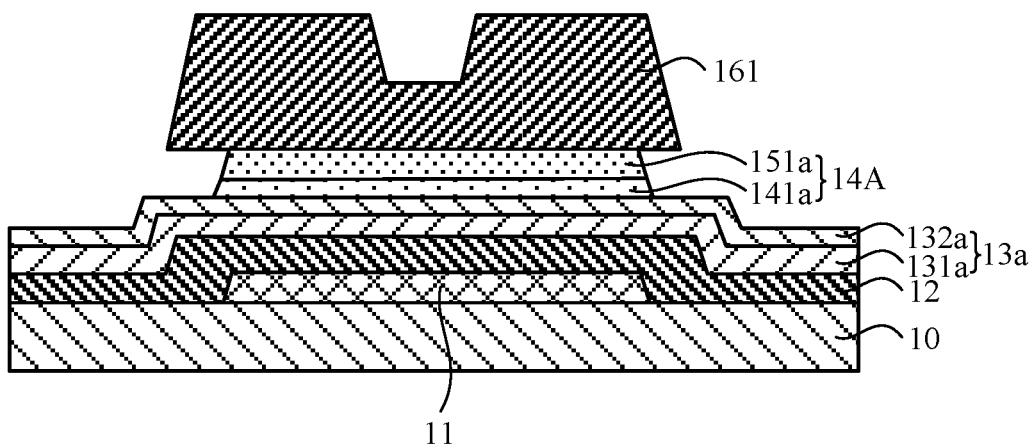

B13: etching the first metal base layer 14a and the second metal base layer 15a to respectively form a first metal layer 141a and a second metal layer 151a. As shown in FIG. 2D, the first metal layer 141a and the second metal layer 151a configure a source/drain electrode pattern 14A.

The first wet etching: using the first photoresist pattern 161 as a mask, the first metal base layer 14a and the second metal base layer 15a are etched using a wet etching process.

Specifically, the portions of the first metal base layer 14a and the second metal base layer 15a that are not covered by the first photoresist pattern 161 are etched away by using an etching solution. Since the wet etching is isotropic to materials, the first metal layer 141a and the second metal layer 151a formed after etching have over-etched regions (not marked in the figure) under the first photoresist pattern 161.

It should be noted that the specific composition of the etching solution used in the first wet etching can be referred to the prior art, which will not be repeated herein.

Figure 2E:
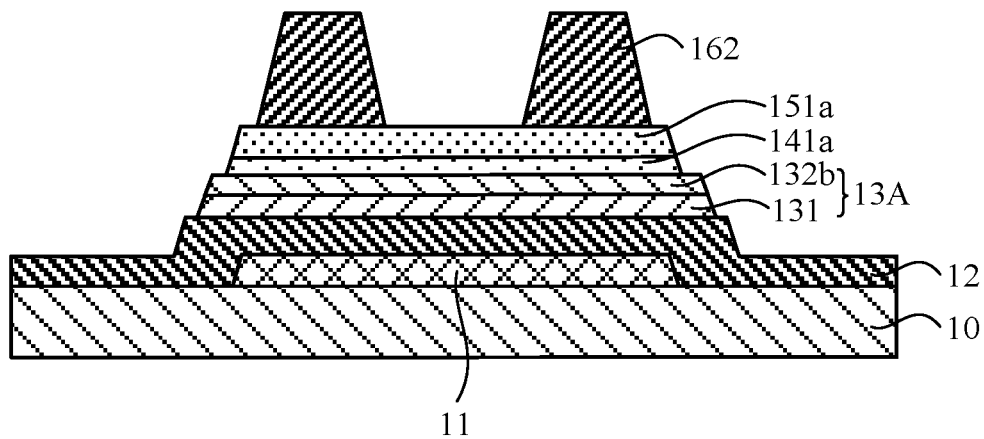

B14: etching the active base layer 13a to form an active layer pattern 13A, as shown in FIG. 2E.

The first dry etching: the first photoresist pattern 161 and the active base layer 13a are etched using a dry etching process. The dry etching process may be performed in an oxygen atmosphere. Specifically, ashing is performed on the first photoresist pattern 161 to reduce the thickness of the first photoresist pattern 161 and to remove a portion of the middle region of the first photoresist pattern 161 to form a second photoresist pattern 162. At the same time, the active base layer 13a is etched to form the active layer pattern 13A. The active layer pattern 13A includes an amorphous silicon layer 131 and an ohmic contact pattern 132b. The amorphous silicon layer 131 is formed by etching the amorphous silicon base layer 131a, and the ohmic contact pattern 132b is formed by etching the ohmic contact base layer 132a.

Figure 2F:
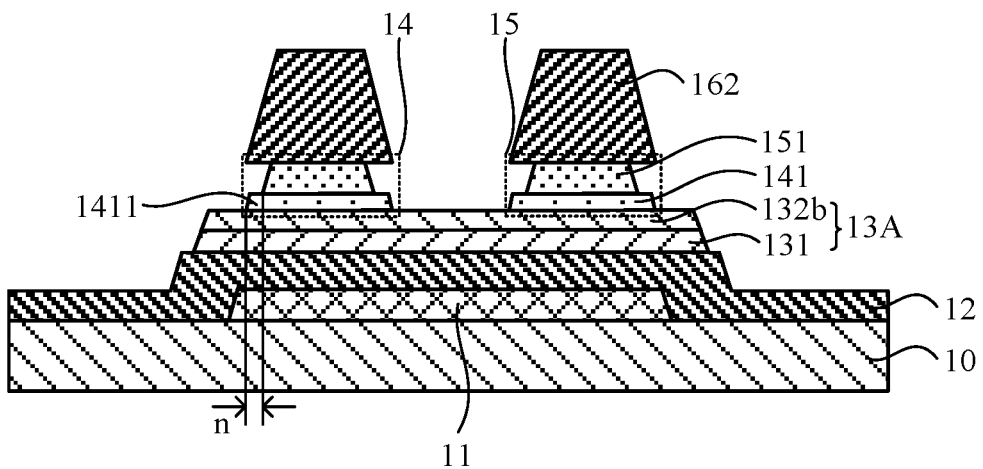

B15: using an etching solution to etch the first metal layer 141a and the second metal layer 151a to respectively form a metal barrier layer 141 and a conductive metal layer 151. The source/drain electrode pattern 14A is turned into a source electrode 14 and a drain electrode 15, as shown in FIG. 2F. Wherein, the etching rate of the first metal layer 141a in the etching solution is less than an etching rate of the second metal layer 151a in the etching solution.

The second wet etching: using the second photoresist pattern 162 as a mask, the first metal layer 141a and the second metal layer 151a are etched using a wet etching process.

Specifically, an etching solution is used to etch away the portions of the first metal layer 141a and the second metal layer 151a that are not covered by the second photoresist pattern 162. Since the wet etching is isotropic to materials, the metal barrier layer 141 and the conductive metal layer 151 have over-etched regions (not marked in the figure) under the second photoresist pattern 162.

Further, the etching solution used in the etching process of the first metal layer 141a and the second metal layer 151a includes an acidic oxidant and a metal etchant. The metal etchant is used to control the etching rate of the second metal layer 151a. Specifically, the acidic oxidant may be hydrogen peroxide. The metal etchant may be a molybdenum etchant.

In the present embodiment, in order to ensure that the etching rate of the first metal layer 141a in the etching solution is less than the etching rate of the second metal layer 151a in the etching solution, the mass content of the acidic oxidant in the etching solution is set to between 5% and 6%, and the mass content of the metal etchant in the etching solution is set to between and 0.05%. The etching rate of the first metal layer 141a in the etching solution can be greatly reduced within the above range, so that the metal barrier layer 141 formed after etching is more outwardly protruding than the conductive metal layer 151.

In some embodiments, the mass content of the acidic oxidant in the etching solution may be 5%, 5.1%, 5.2%, 5.3%, 5.4%, 5.5%, 5.6%, 5.7%, 5.9% or 6%. In other embodiments, the mass content of the metal etchant in the etching solution may be 0.01%, 0.015%, 0.02%, 0.025%, 0.03%, 0.04%, 0.045%, or 0.05%.

As shown in FIG. 2F, at the end of the source electrode 14 away from the drain electrode 15 and the end of the drain electrode 15 away from the source electrode 14, the protruding portion of the metal barrier layer 141 comparing to the conductive metal layer 151 is referred to as the first protrusion 1411. In the source electrode 14, the first protrusion 1411 extends from the drain electrode 15 toward the source electrode 14. In the drain electrode 15, the first protrusion 1411 extends from the source electrode 14 toward the drain electrode 15. It should be noted that, in the corresponding drawings of the present embodiment, only the first protrusion 1411 in the source electrode 14 is marked, but it should not be understood as a limitation of the present application.

Specifically, a length n of the first protrusion 1411 obtained by the method of the present embodiment can reach between 0.05 microns (μm) and 1.0 μm. In some embodiments, the length n of the first protrusion 1411 may be 0.05 μm, 0.08 μm, 0.1 μm, 0.2 μm, 0.3 μm, 0.5 μm, 0.8 μm, or 1.0 μm.

It should be noted that, in some embodiments, the etching solution used in the second wet etching may also comprise acid stabilizers, pH regulators, etching inhibitors, metal ion stabilizers, and regulators. The specific ingredients of the etching solution can be selected according to actual application requirements, which is not limited in the present application.

Figure 2G:
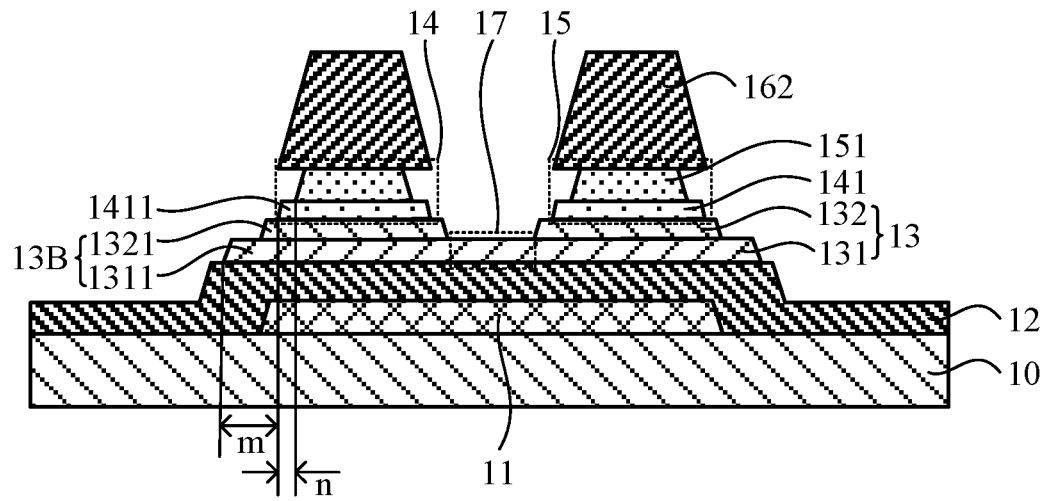

B16: etching the active layer pattern 13A to form an active layer 13. The active layer 13 disposed between the source electrode 14 and the drain electrode 15 is referred to as a channel region 17. As shown in FIG. 2G, at the ends of the source electrode 14 away from the channel region 17 and/or the drain electrode 15 away from the channel region 17, the metal barrier layer 141 includes the first protrusion 1411, which extends from the end portion of the conductive metal layer 151 in a direction away from the channel region 17.

The second dry etching: using the second photoresist pattern 162 as a mask, the active layer pattern 13A is etched using a dry etching process.

Specifically, using the second photoresist pattern 162 as a mask, the ohmic contact pattern 132b of the active layer pattern 13A is etched to form an ohmic contact layer 132. The ohmic contact layer 132 and the amorphous silicon layer 131 configure the active layer 13, and the ohmic contact layer 132 are in contact with the corresponding source electrode 14/drain electrode 15, respectively. Specifically, the amorphous silicon layer 131 includes a first sub-protrusion 1311. The ohmic contact layer 132 includes a second sub-protrusion layer 1321. At the end of the source electrode 14 away from the channel region 17 and the end of the drain electrode 15 away from the channel region 17, the first sub-protrusion 1311 and the second sub-protrusion 1321 both extend from the end portion of the first protrusion 1411 toward a direction away from the channel region 17. The first sub-protrusion 1311 and the second sub-protrusion 1321 configure the second protrusion 13B of the active layer 13.

Due to the first protrusion 1411 is formed in the metal barrier layer 141 during the second wet etching of the present embodiment, the length of the second protrusion 13B after the second wet etching can be reduced comparing to that of a conventional metal barrier layer without forming any outward protrusion. That is, in the present embodiment, the length of outward protrusion of the active layer comparing to the source electrode and the drain electrode is reduced by making the metal barrier layer 141 is more outwardly protruding than the conductive metal layer 151. As a result, the difference between the parasitic capacitance formed among the gate electrode and the source electrode/drain electrode under light and non-light conditions can be reduced, which is beneficial to improve the stability of the driving signal of the array substrate.

In the present embodiment, the length m of the second protrusion 13B is between 0 μm and 2 μm in a direction from the channel region 17 toward the source electrode 14. That is, in the present embodiment, by providing the first protrusion 1411 in the metal barrier layer 141, the length m of the second protrusion 13B can be reduced to 2 μm or less. In some specific embodiments, the length m of the second protrusion 13B may be 0.05 μm, 0.1 μm, 0.2 μm, 0.3 μm, 0.5 μm, 0.6 μm, 0.8 μm, 1.0 μm, 1.2 μm, 1.5 μm, 1.8 μm, or 2 μm.

Figure 2H:
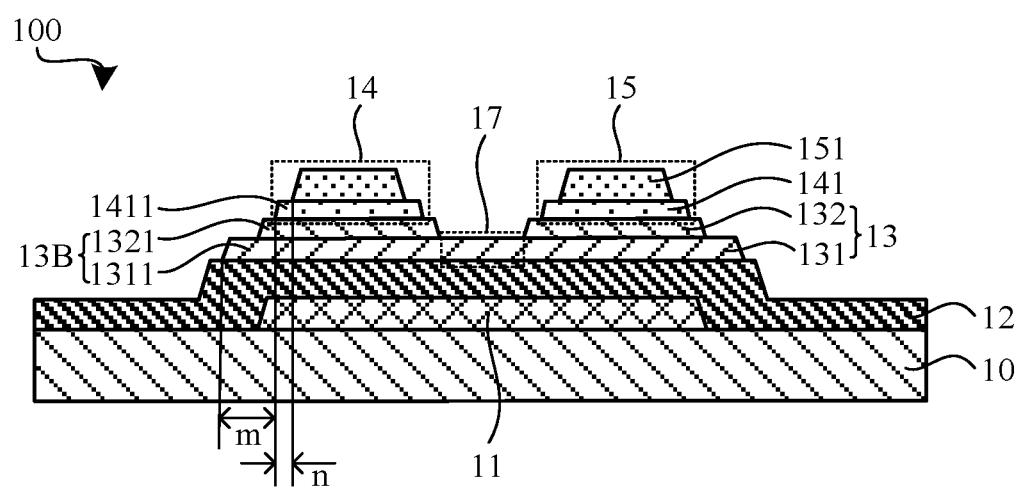

After the step B16, the method further includes: stripping off the second photoresist pattern 162 to form a structure as shown in FIG. 2H.

It should be noted that, after the second photoresist pattern 162 is stripped, the method for fabricating the array substrate 100 of the present embodiment further includes forming a passivation layer on the conductive metal layer 151, forming through vias in the passivation layer to expose the source electrode 14/the drain electrode 15, and forming pixel electrodes, which are electrically connecting to the source electrode 14 and the drain electrode 15, on the passivation layer and in the through vias. The related technology can be referred to the prior art, which will not be repeated herein.

Thus, the method for fabricating the array substrate 100 provided in the first embodiment of the present application is completed.

Figure 3:
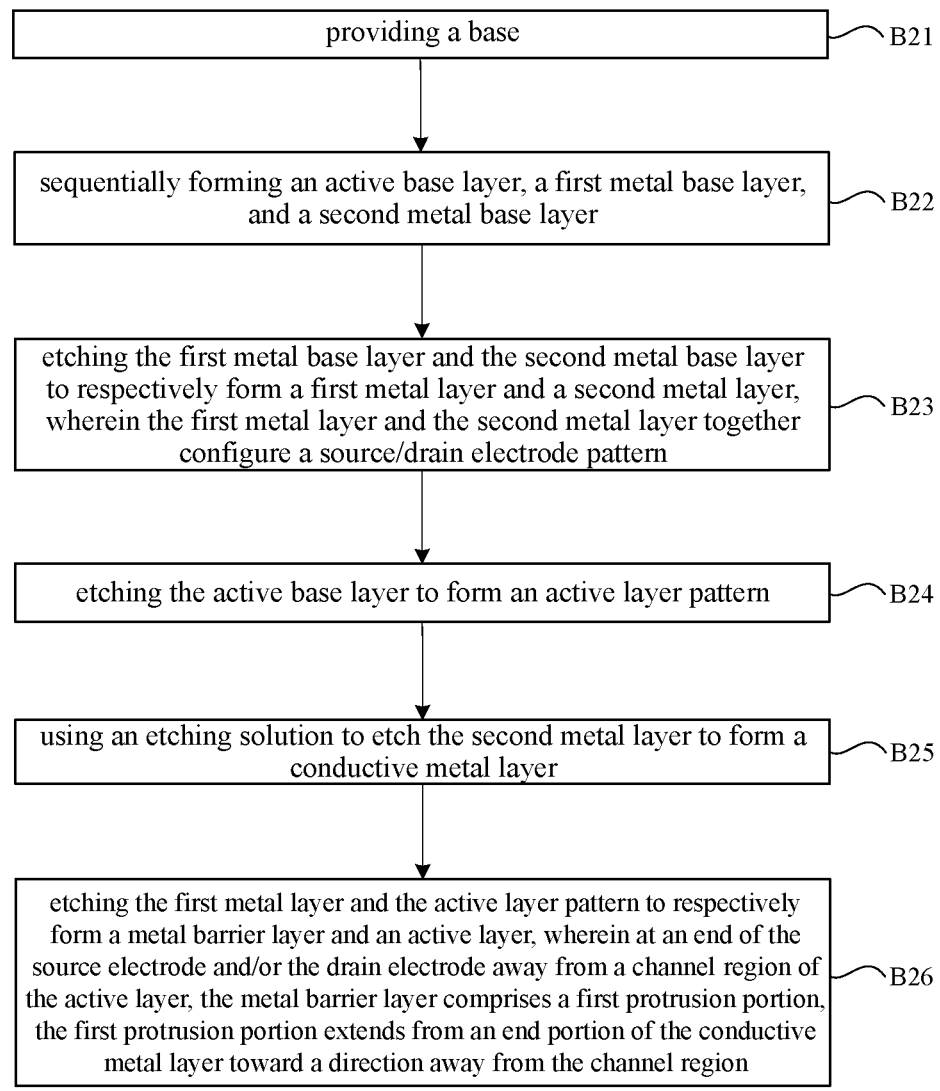
FIG. 3 is a flowchart of a method for fabricating an array substrate provided by a second embodiment of the present application.

Referring to FIG. 3, a second embodiment of the present application provides a method for fabricating an array substrate including the following steps:

B21: providing a base;

B22: sequentially forming an active base layer, a first metal base layer and a second metal base layer on the substrate;

B23: etching the first metal base layer and the second metal base layer to respectively form a first metal layer and a second metal layer, wherein the first metal layer and the second metal layer together configure a source/drain electrode pattern;

B24: etching the active base layer to form an active layer pattern;

B25: using an etching solution to etch the second metal layer to form a conductive metal layer;

B26: etching the first metal layer and the active layer pattern to respectively form a metal barrier layer and an active layer, wherein at an end of the source electrode away from a channel region of the active layer and/or the drain electrode away from a channel region of the active layer, the metal barrier layer includes a first protrusion, the first protrusion extends from an end portion of the conductive metal layer toward a direction away from the channel region.

Accordingly, in the method for fabricating the array substrate provided by the second embodiment of the present application, the first metal layer is not etched during the step of etching the second metal layer. After the formation of the conductive metal layer etched from the second metal layer, the first metal layer 141a is concurrently etched during etching the active layer pattern to respectively form the metal barrier layer and the active layer so that the metal barrier layer includes the first protrusion which is more outwardly protruding than the conductive metal layer. Because the first protrusion is disposed on the active layer, the formation of the first protrusion may reduce a length of outward protrusion of the active layer comparing to the metal barrier layer. That is, the length of outward protrusion of the active layer comparing to the source electrode and/or the drain electrode is reduced. As a result, the difference between the parasitic capacitance formed among the gate electrode and the source electrode/the drain electrode under light and non-light conditions can be reduced, which is beneficial to improve the stability of the driving signal of the array substrate.

The method for fabricating the array substrate provided by the second embodiment of the present application will be described in the following.

It should be noted that the array substrate in this embodiment includes thin film transistors. The thin film transistors can be top-gate structure or bottom-gate structure. This embodiment only uses a bottom-gate thin film transistor as an example but is not limited thereto.

Referring to FIG. 3 and FIG. 4A to FIG. 4H, the method for fabricating the array substrate 100 provided by the second embodiment of the present application includes the following steps:

B21: providing a base 10.

B22: sequentially forming an active base layer 13a, a first metal base layer 14a, and a second metal base layer 15a on the base 10.

B23: etching the first metal base layer 14a and the second metal base layer 15a to respectively form a first metal layer 141a and a second metal layer 151a. The first metal layer 141a and the second metal layer 151a configure a source/drain electrode pattern 14A.

B24: etching the active base layer 13a to form an active layer pattern 13A. With reference to FIGS. 4A to 4E, the specific process flow of the steps B21 to B24 can be referred to the description of the steps B11 to B14 in the foregoing embodiment, which will not be repeated herein.

Figure 4A:
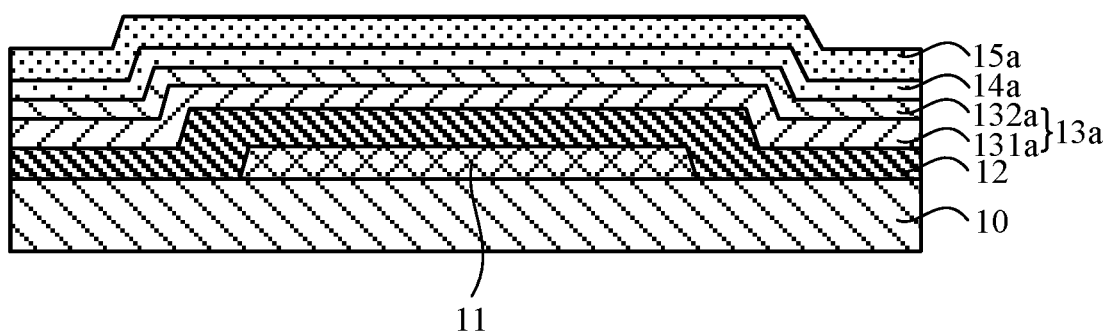
FIGS. 4A to 4H are schematic structural diagrams sequentially obtained at each stage in the method for fabricating the array substrate shown in FIG. 3.
Figure 4B:
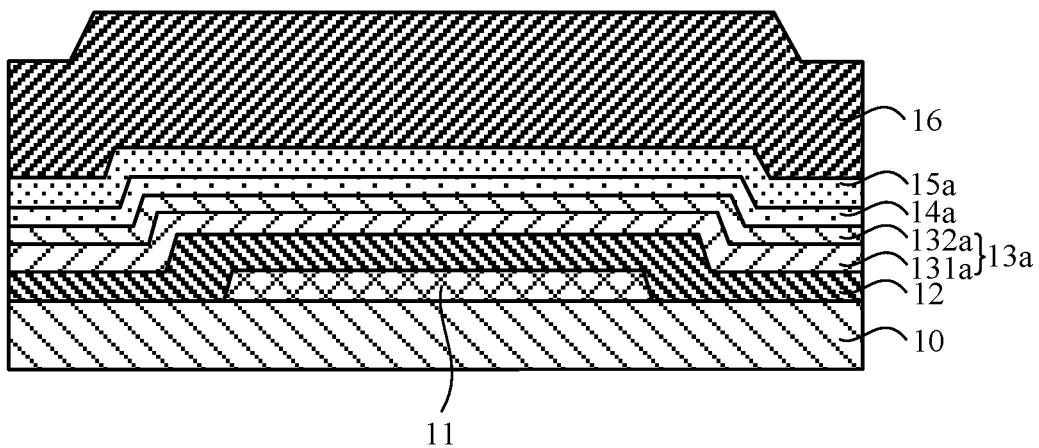
Figure 4C:
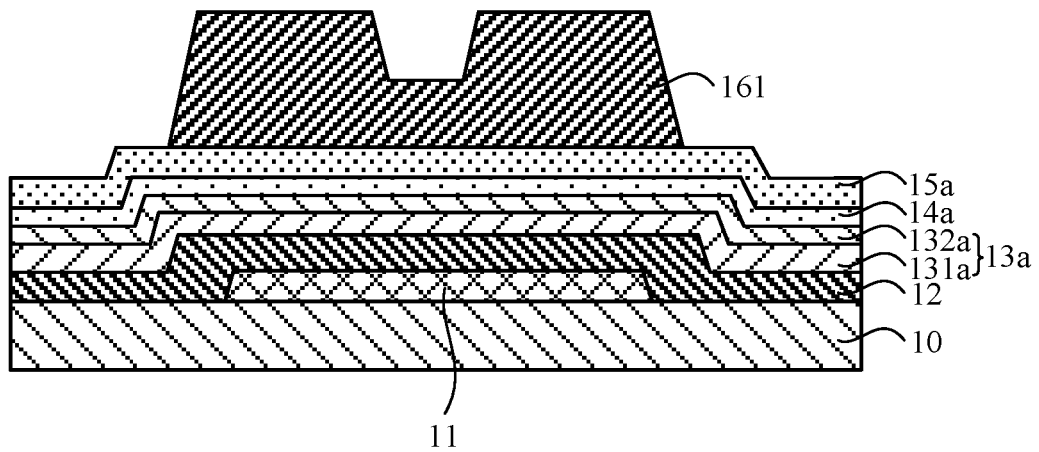
Figure 4D:
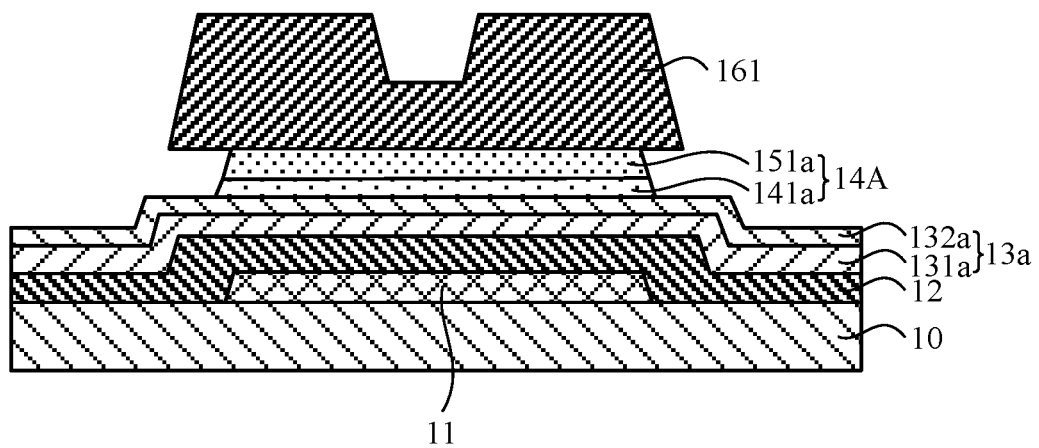
Figure 4E:
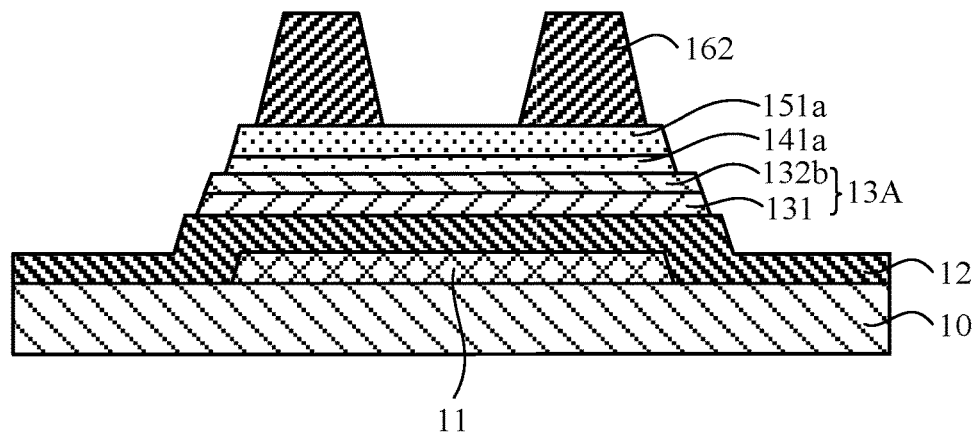
Figure 4F:
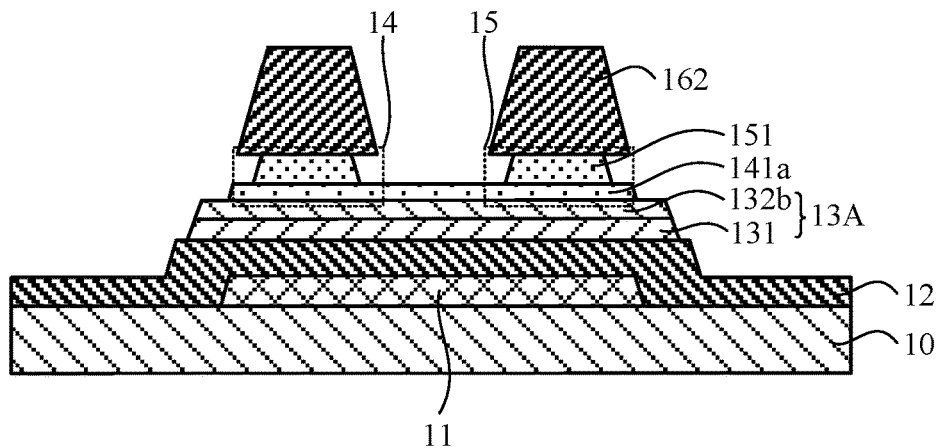

B25: using an etching solution to etch the second metal layer 151a to form a conductive metal layer as shown in FIG. 4F.

The second wet etching: using the second photoresist pattern 162 as a mask, the second metal layer 151a is etched using a wet etching process. Specifically, an etching solution is used to etch away the portions of the second metal layer 151a that are not covered by the second photoresist pattern 162. Since the wet etching is isotropic to materials, the conductive metal layer 151 has over-etched regions (not marked in the figure) under the second photoresist pattern 162.

A difference between the etching solution used in the step B25 and the etching solution used in the step B15 of the foregoing embodiment is that the etching solution in the present embodiment does not use molybdenum etchant to ensure that the first metal layer 141a is not etched during the second wet etching.

Figure 4G:
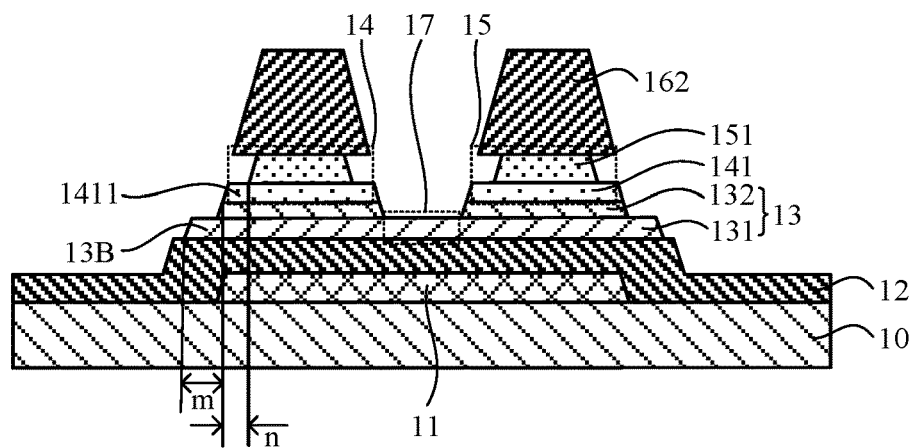

B26: etching the first metal layer 141a and the active layer pattern 13A to respectively form a metal barrier layer 141 and an active layer 13. A region of the active layer 13 disposed between the source electrode 14 and the drain electrode 15 is referred to as a channel region 17. As shown in FIG. 4G, at the ends of the source electrode 14 away from the channel region 17 and/or the drain electrode 15 away from the channel region 17, the metal barrier layer 141 includes a first protrusion 1411. The first protrusion 1411 extends from an end portion of the conductive metal layer 151 in a direction away from the channel region 17.

The second dry etching: using the second photoresist pattern 162 as a mask, the first metal layer 141a and the active layer pattern 13A are etched using a dry etching process.

Specifically, using the second photoresist pattern 162 as a mask, the first metal layer 141a and the ohmic contact pattern 132b of the active layer pattern 13A are etched to respectively form a metal barrier layer 141 and an ohmic contact layer 132. The ohmic contact layer 132 and the amorphous silicon layer 131 configure the active layer 13, and the ohmic contact layer 132 are in contact with the corresponding source electrode 14 and the drain electrode 15, respectively. Wherein, at the end of the source electrode 14 away from the drain electrode 15 and the end of the drain electrode 15 away from the source electrode 14, the metal barrier layer 141 further forms first protrusions 1411 comparing to the conductive metal layer 151. In the source electrode 14, the first protrusion 1411 extends from the drain electrode 15 toward the source electrode 14. In the drain electrode 15, the first protrusion 1411 extends from the source electrode 14 toward the drain electrode 15. It should be noted that, in the corresponding drawings of the present embodiment, only the first protrusion 1411 in the source electrode 14 is marked, but it should not be understood as a limitation of the present application.

In the present embodiment, the end of the source electrode 14 away from the channel region 17 and the end of the drain electrode 15 away from the channel region 17, the sidewalls of the ohmic contact layer 132 and the sidewalls of the first protrusions 1411 are flush. The amorphous silicon layer 131 includes a second protrusion 13B. The second protrusion 13B extends from the end portion of the first protrusion 1411 toward a direction away from the channel region 17.

In the present embodiment, the first metal layer 141a is not etched during the second wet etching; instead, the first metal layer 141a and the active layer pattern 13A are concurrently etched during the second dry etching. The above-mentioned etching processes can further increase the length n of the first protrusion 1411 of the metal barrier layer 141. In addition, due to the first protrusion 1411 and the ohmic contact layer 132 are concurrently formed, the sidewalls of the ohmic contact layer 132 and the sidewalls of the first protrusions 1411 are flush so that the ohmic contact layer 132 do not mask the underlying amorphous silicon layer 131. As a result, the length of outward protrusion of the amorphous silicon layer 131 comparing to the first protrusion 1411 can be reduced. That is, the length of the second protrusion 13B of the active layer 13 can be further reduced. Therefore, in the present embodiment, the length of outward protrusion of the active layer 13 comparing to the source electrode 14 and the drain electrode 15 is reduced by making the metal barrier layer 141 is more outwardly protruding than the conductive metal layer 151. As a result, the difference between the parasitic capacitance formed among the gate electrode 11 and the source electrode 14/the drain electrode 15 under light and non-light conditions can be reduced, which is beneficial to improve the stability of the driving signal of the array substrate 100.

Specifically, the length n of the first protrusion 1411 obtained by the method of the present embodiment can reach between 0.05 μm and 1.5 μm. In some specific embodiments, the length n of the first protrusion 1411 may be 0.05 μm, 0.08 μm, 0.1 μm, 0.2 μm, 0.3 μm, 0.5 μm, 0.8 μm, 1.0 μm, 1.1 μm, 1.2 μm, 1.3 μm, 1.4 μm, or 1.5 μm.

Accordingly, the length m of the second protrusion 13B is between μm and 2 μm. That is, in the present embodiment, by providing the first protrusion 1411 in the metal barrier layer 141, the length m of the second protrusion 13B can be reduced to 2 μm or less. In some specific embodiments, the length m of the second protrusion 13B may be 0.05 μm, 0.1 μm, 0.2 μm, μm, 0.5 μm, 0.6 μm, 0.8 μm, 1.0 μm, 1.2 μm, 1.5 μm, 1.8 μm, or 2 μm.

Figure 4H:
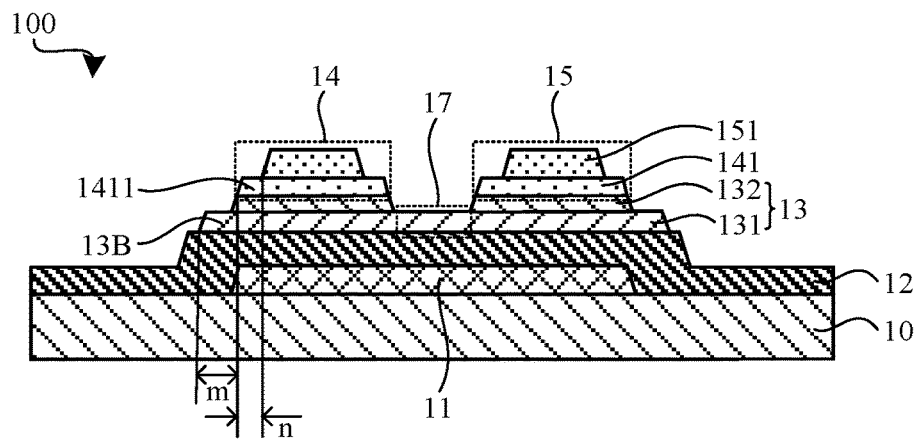

After the step B26, the method further includes: stripping off the second photoresist pattern 162 to form a structure as shown in FIG. 4H.

It should be noted that, after the second photoresist pattern 162 is stripped, the method for fabricating the array substrate 100 of the present embodiment further includes forming a passivation layer on the conductive metal layer 151, forming through vias in the passivation layer to expose the source electrode 14/the drain electrode 15, and forming pixel electrodes, which are electrically connecting to the source electrode 14 and the drain electrode 15, on the passivation layer and in the through vias. The related technology can be referred to the prior art, which will not be repeated herein.

Thus, the method for fabricating the array substrate 100 provided in the second embodiment of the present application is completed.

Figure 5:
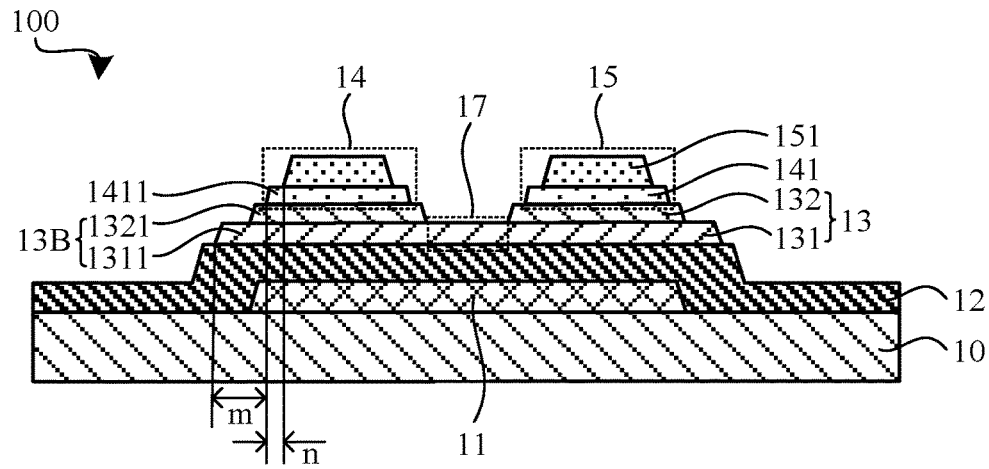
FIG. 5 is a schematic cross-sectional view of an array substrate of the first embodiment of the present application.

Referring to FIG. 5, an array substrate 100 is provided by the first embodiment of the present application. The array substrate 100 includes a base 10, an active layer 13, a source electrode 14, and a drain electrode 15. The active layer 13 is disposed on the base 10. The active layer 13 includes a channel region 17. The source electrode 14 and the drain electrode 15 are disposed on the active layer 13. The source electrode 14 and the drain electrode 15 are located at two opposing sides of the channel region 17. The source electrode 14 and the drain electrode 15 both comprise a metal barrier layer 141 and a conductive metal layer 151 that are sequentially disposed on the active layer 13. At an end of the source electrode 14 and/or the drain electrode 15 away from the channel region 17, the metal barrier layer 141 includes a first protrusion 1411. The first protrusion 1411 extends from the end portion of the conductive metal layer 151 toward a direction away from the channel region 17.

Specifically, the base 10 may be a rigid substrate such as a glass substrate or the base 10 may also be a flexible substrate such as a polyimide substrate. The material of the base 10 is not specifically limited in this application.

The array substrate 100 further includes a gate electrode 11 and a gate insulating layer 12 that are sequentially disposed on the base 10. The gate insulating layer 12 is located at a side of the gate electrode 11 near the active layer 13. Wherein, the active layer 13, the gate electrode 11, the source electrode 14, and the drain electrode 15 configure a thin film transistor (not marked in the figure). It should be noted that the thin film transistor of the present application can be top-gate structure or bottom-gate structure. The present embodiment only uses a bottom-gate thin film transistor as an example but is not limited thereto.

In the present embodiment, the material of the conductive metal layer 151 includes copper. In some embodiments, the material of the conductive metal layer 151 may further comprise one or more of molybdenum, titanium, aluminum, chromium, or nickel.

The material of the metal barrier layer 141 includes at least one of molybdenum or a molybdenum alloy. Wherein, the molybdenum alloy may be a binary alloy of molybdenum. The binary alloy may comprise one of titanium, chromium, nickel, or aluminum other than molybdenum. The molybdenum alloy may also be a ternary alloy of molybdenum. The ternary alloy may comprise any two of titanium, chromium, nickel, and aluminum other than molybdenum.

In the present embodiment, at an end of the source electrode 14 away from the channel and the drain electrode 15 away from the channel, the metal barrier layer 141 may include first protrusions 1411. In some embodiments, the first protrusion 1411 may also be disposed at any one of the ends of the source electrode 14 away from the channel or the end of the drain electrode 15 away from the channel, which will not be repeated herein.

Specifically, the length n of the first protrusion 1411 is between 0.05 μm and 1.0 μm. Specifically, the length n of the first protrusion 1411 may be 0.05 μm, 0.08 μm, 0.1 μm, 0.2 μm, 0.3 μm, 0.5 μm, 0.8 μm, or 1.0 μm.

It should be noted that, in the corresponding drawings of the present embodiment, only the first protrusion 1411 in the source electrode 14 is marked but is not limited thereto.

In the present embodiment, the active layer 13 comprise a second protrusion 13B. The second protrusion 13B extends from an end portion of the first protrusion 1411 toward a direction away from the channel region 17. Since the first protrusion 1411 is located above the active layer 13, the configuration of the first protrusion 1411 of the present embodiment can cover a portion of the active layer 13 comparing to the metal barrier layer without any outward protrusion in the prior art. As a result, the length of outward protrusion of the active layer 13 comparing to the source electrode 14/the drain electrode 15 may be reduced. That is, the length of the second protrusion 13B is reduced.

The length m of the second protrusion 13B is between 0 μm and 2 μm in a direction from the channel region 17 toward the source electrode 14. That is, in the present embodiment, by providing the first protrusion 1411 in the metal barrier layer 141, the length m of the second protrusion 13B can be reduced to 2 μm or less. In some specific embodiments, the length m of the second protrusion 13B may be 0.05 μm, 0.1 μm, 0.2 μm, 0.3 μm, 0.5 μm, 0.6 μm, 0.8 μm, 1.0 μm, 1.2 μm, 1.5 μm, 1.8 μm, or 2 μm.

In the present embodiment, the active layer 13 comprise an amorphous silicon layer 131 and an ohmic contact layer 132. The ohmic contact layer 132 is located on a side of the amorphous silicon layer 131 near the metal barrier layer 141. In some embodiments, the active layer 13 may only comprise the amorphous silicon layer 131, which will not be repeated herein.

The second protrusion 13B includes a first sub-protrusion 1311 and a second sub-protrusion 1321. The first sub-protrusion 1311 is located in the amorphous silicon layer 131. The second sub-protrusion 1321 is located in the ohmic contact layer 132. At the end of the source electrode 14 away from the channel region 17 and the end of the drain electrode 15 away from the channel region 17, both the first sub-protrusion 1311 and the second sub-protrusion 1321 extend from the end portion of the first protrusion 1411 toward a direction away from the channel region 17. Wherein, the length m of the second protrusion 13B is the length of the first sub-protrusion 1311 (not marked in the figure).

Since parasitic capacitance will form among the gate electrode 11, the source electrode 14/the drain electrode 15, and storage capacitor (not shown in figure), the length m of the second protrusion 13B is reduced to 2 μm or less so as to reduce the difference between the parasitic capacitance of the array substrate 100 under light and non-light conditions, which is beneficial to improve the stability of the driving signal of the array substrate 100.

It should be noted that the array substrate 100 in the present embodiment can be fabricated by using the method for fabricating the array substrate 100 provided in the foregoing first embodiment, and the relevant method can refer to the description of the foregoing first embodiment, which will not be repeated herein.

Figure 6:
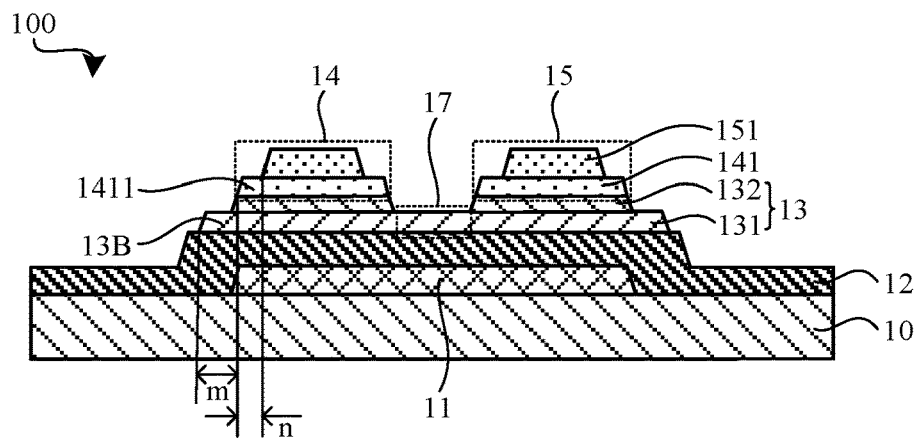
FIG. 6 is a schematic cross-sectional view of an array substrate of the second embodiment of the present application.

Referring to FIG. 6, the second embodiment of the present application provides an array substrate 100. The difference between the array substrate 100 provided in the second embodiment of the present application and the first embodiment is that the second protrusion 13B is located in the amorphous silicon layer 131. At an end of the source electrode 14 away from the channel region 17 and/or the drain electrode 15 away from the channel region 17, the sidewalls of the ohmic contact layer 132 and the sidewalls of the first protrusion 1411 are flush. The length n of the first protrusion 1411 is between 0.05 μm and 1.5 μm.

In the present embodiment, at the end of the source electrode 14 away from the channel region 17 and at the end of the drain electrode 15 away from the channel region 17, the sidewalls of the ohmic contact layer 132 and the sidewalls of the first protrusions 1411 are flush. In some embodiments, at the end of the source electrode 14 away from the channel region 17 and at the end of the drain electrode 15 away from the channel region 17, the sidewalls of the ohmic contact layer 132 are set to flush with the sidewalls of the first protrusions 1411.

In some specific embodiments, the length n of the first protrusion 1411 may be 0.05 μm, 0.08 μm, 0.1 μm, 0.2 μm, 0.3 μm, 0.5 μm, 0.8 μm, 1.0 μm, 1.1 μm, 1.2 μm, 1.3 μm, 1.4 μm, or 1.5 μm.

On one hand, in the present embodiment, by setting the length n of the first protrusion 1411 between 0.05 μm and 1.5 μm, the first protrusion 1411 covers a portion of the amorphous silicon layer 131, thereby reducing the length of outward protrusion of the amorphous silicon layer 131 comparing to the metal barrier layer 141. On the other hand, the sidewall of the ohmic contact layer 132 is flush with the sidewall of the first protrusion 1411, that is, the ohmic contact layer 132 does not cover the underlying amorphous silicon layer 131. Therefore, in the present embodiment, the length of outward protrusion of the amorphous silicon layer 131 comparing to the metal barrier layer 141 can be greatly reduced, thereby reducing the length of outward protrusion of the active layer 13 comparing to the source electrode 14 and the drain electrode 15. That is, the length of the second protrusion 13B is reduced.

The length m of the second protrusion 13B is between 0 μm and 2 μm in a direction from the channel region 17 toward the source electrode 14. That is, in the present embodiment, by providing the first protrusion 1411 in the metal barrier layer 141 and setting the sidewall of the ohmic contact layer 132 flush with the sidewall of the first protrusion 1411, the length m of the second protrusion 13B can be reduced to 2 μm or less. In some specific embodiments, the length m of the second protrusion 13B may be 0.05 μm, 0.1 μm, 0.2 μm, 0.3 μm, 0.5 μm, 0.6 μm, 0.8 μm, 1.0 μm, 1.2 μm, 1.5 μm, 1.8 μm, or 2 μm.

It should be noted that the array substrate 100 in the present embodiment can be fabricated by using the method for fabricating the array substrate 100 provided in the foregoing second embodiment, and the relevant method can refer to the description of the foregoing second embodiment, which will not be repeated herein.

The embodiment of the present application may also provide a display panel. The display panel includes an array substrate 100. The array substrate 100 may be the array substrate 100 described in any one of the foregoing embodiments, and the specific structure of the array substrate 100 may refer to the description of the foregoing embodiment, which will not be repeated herein.

Specifically, in the present embodiment, the display panel is a liquid crystal display panel. In some embodiments, the display panel may also be an organic light emitting diode display panel, which will not be repeated herein.

When the array substrate 100 in the foregoing embodiment is applied to a display panel, the difference in parasitic capacitance under positive and negative field conditions can be reduced during the driving process of the display panel, and the probability of lateral crosstalk of the display panel under an electric field can be reduced, which is conducive for improving the display taste of display products.

The above describes in detail an array substrate, a method for fabricating the same, and a display panel provided by the embodiments of the present application. Specific examples are used in this article to illustrate the principles and implementations of the present application. The description of the above embodiments is only for helping understand the methods and core ideas of this application; at the same time, for those skilled in the art, according to the ideas of this application, there will be changes in the specific implementation and the scope of application. In summary, the content of this specification does not as a limitation of the present application.

What is claimed is:

1. An array substrate, comprising:
a base;
a gate electrode, disposed on the base;
an active layer disposed on a side of the gate electrode which is away from the base and comprising a channel region, wherein an orthographic projection of the channel region on the base is overlapped with an orthographic projection of the gate electrode on the base; wherein the active layer comprises an amorphous silicon layer and an ohmic contact layer disposed on the amorphous silicon layer;
a source electrode disposed on the active layer; and
a drain electrode disposed on the active layer, wherein the source electrode and the drain electrode are located at two opposing sides of the channel region, and each of the source electrode and the drain electrode comprise a metal barrier layer and a conductive metal layer that are sequentially disposed on the active layer; wherein the metal barrier layer is disposed on the ohmic contact layer, and the conductive metal layer is disposed on the metal barrier layer;
wherein at an end of the source electrode away from the channel region and/or at an end of the drain electrode away from the channel region, the metal barrier layer comprises a first protrusion, and the first protrusion extends from an end portion of the conductive metal layer toward a direction away from the channel region, and the active layer comprises a second protrusion that extends from an end portion of the first protrusion of the metal barrier layer towards the direction away from the channel region;
wherein the second protrusion of the active layer comprises a first sub-protrusion located in the amorphous silicon layer and a second sub-protrusion located in the ohmic contact layer; wherein at the end of the source electrode away from the channel region and/or at the end of the drain electrode away from the channel region, each of the first sub-protrusion and the second sub-protrusion extends from the end portion of the first protrusion of the metal barrier layer toward the direction away from the channel region;
wherein an orthographic projection of the first protrusion on the base is overlapped with the orthographic projection of the gate electrode on the base.

2. The array substrate of claim 1, wherein a length of the first protrusion is between 0.05 microns (μm) and 1.5 μm in a direction from the channel region toward the source electrode and/or the drain electrode.

3. The array substrate of claim 2, wherein the length of the first protrusion is between 1.0 μm and 1.5 μm.

4. The array substrate of claim 1, wherein
at the end of the source electrode away from the channel region and/or at the end of the drain electrode away from the channel region, a sidewall of the second sub-protrusion of the ohmic contact layer is not flush with a sidewall of the first protrusion of the metal barrier layer, and a sidewall of the first sub-protrusion of the amorphous silicon layer is not flush with the sidewall of the second sub-protrusion of the ohmic contact layer.

5. The array substrate of claim 1, wherein a length of the second protrusion is between 0 μm and 2 μm in a direction from the channel region toward the source electrode and/or the drain electrode.

6. The array substrate of claim 1, wherein a material of the metal barrier layer comprises at least one of molybdenum or a molybdenum alloy, and a material of the conductive metal layer comprises copper.

7. A display panel comprising an array substrate, and the array substrate comprising:
a base;
a gate electrode, disposed on the base;
an active layer disposed on a side of the gate electrode which is away from the base and comprising a channel region, wherein an orthographic projection of the channel region on the base is overlapped with an orthographic projection of the gate electrode on the base; wherein the active layer comprises an amorphous silicon layer and an ohmic contact layer disposed on the amorphous silicon layer;

a source electrode disposed on the active layer; and a drain electrode disposed on the active layer, wherein the source electrode and the drain electrode are located at two opposing sides of the channel region, and each of the source electrode and the drain electrode comprises a metal barrier layer and a conductive metal layer that are sequentially disposed on the active layer; wherein the metal barrier layer is disposed on the ohmic contact layer, and the conductive metal layer is disposed on the metal barrier layer;

wherein at an end of the source electrode away from the channel region and/or at an end of the drain electrode away from the channel region, the metal barrier layer comprises a first protrusion, and the first protrusion extends from an end portion of the conductive metal layer toward a direction away from the channel region, and the active layer comprises a second protrusion that extends from an end portion of the first protrusion of the metal barrier layer towards the direction away from the channel region;

wherein the second protrusion of the active layer comprises a first sub-protrusion located in the amorphous silicon layer and a second sub-protrusion located in the ohmic contact layer; wherein at the end of the source electrode away from the channel region and/or at the end of the drain electrode away from the channel region, each of the first sub-protrusion and the second sub-protrusion extends from the end portion of the first protrusion of the metal barrier layer toward the direction away from the channel region;

wherein an orthographic projection of the first protrusion on the base is overlapped with the orthographic projection of the gate electrode on the base.

8. The display panel of claim 7, wherein a length of the first protrusion is between 0.05 microns (μm) and 1.5 μm in a direction from the channel region toward the source electrode and/or the drain electrode.

9. The display panel of claim 8, wherein the length of the first protrusion is between 1.0 μm and 1.5 μm.

10. The display panel of claim 7,
wherein at the end of the source electrode away from the channel region and/or at the end of the drain electrode away from the channel region, a sidewall of the second sub-protrusion of the ohmic contact layer is not flush with a sidewall of the first protrusion of the metal barrier layer, and a sidewall of the first sub-protrusion of the amorphous silicon layer is not flush with the sidewall of the second sub-protrusion of the ohmic contact layer.

11. The display panel of claim 7, wherein a length of the second protrusion is between 0 μm and 2 μm in a direction from the channel region toward the source electrode and/or the drain electrode.

12. The display panel of claim 7, wherein a material of the metal barrier layer comprises at least one of molybdenum or a molybdenum alloy, and a material of the conductive metal layer comprises copper.

13. A method for fabricating an array substrate, comprising:
providing a base;
forming a gate electrode on the base;
sequentially forming an active base layer, a first metal base layer, and a second metal base layer on a side of the gate electrode which is away from the base;
etching the first metal base layer and the second metal base layer to form a first metal layer and a second metal layer, respectively, wherein the first metal layer and the second metal layer configure a source/drain electrode pattern;
etching the active base layer to form an active layer pattern;
etching the first metal layer and the second metal layer simultaneously by using an etching solution to form a metal barrier layer and a conductive metal layer, respectively, wherein the source/drain electrode pattern is turned into a source electrode and a drain electrode, an etching rate of the first metal layer in the etching solution is less than an etching rate of the second metal layer in the etching solution; and
etching the active layer pattern to form an active layer, wherein the active layer comprises a channel region, an orthographic projection of the channel region on the base is overlapped with an orthographic projection of the gate electrode on the base; and the active layer comprises an amorphous silicon layer and an ohmic contact layer disposed on the amorphous silicon layer; wherein the metal barrier layer is disposed on the ohmic contact layer, and the conductive metal layer is disposed on the metal barrier layer;
wherein at an end of the source electrode away from a channel region of the active layer and/or at an end of the drain electrode away from the channel region of the active layer, the metal barrier layer comprises a first protrusion, and the first protrusion extends from an end portion of the conductive metal layer toward a direction away from the channel region;
wherein forming the active base layer comprises sequentially forming an amorphous silicon base layer and an ohmic contact base layer, wherein the active layer pattern comprises an amorphous silicon layer and an ohmic contact pattern, and the step of etching the active layer pattern comprises:
etching the ohmic contact pattern to form the ohmic contact layer, wherein the amorphous silicon layer comprises a first sub-protrusion, and the ohmic contact layer comprises a second sub-protrusion; and at the end of the source electrode away from the channel region and/or at the end of the drain electrode away from the channel region, each of the first sub-protrusion and the second sub-protrusion extends from an end portion of the first protrusion of the metal barrier layer toward the direction away from the channel region;
wherein an orthographic projection of the first protrusion on the base is overlapped with the orthographic projection of the gate electrode on the base.

14. The method for fabricating the array substrate of claim 5, wherein in the step of etching the first metal layer and the second metal layer by using the etching solution to respectively form the metal barrier layer and the conductive metal layer, the etching solution comprises an acidic oxidant and a metal etchant, a mass content of the acidic oxidant in the etching solution is between 5% and 6%, and a mass content of the metal etchant in the etching solution is between 0.01% and 0.05%.

15. The method for fabricating the array substrate of claim 14, wherein a material of the first metal layer comprises at least one of molybdenum or a molybdenum alloy, a material of the conductive metal layer comprises copper, the acidic oxidant is hydrogen peroxide, and the metal etchant is a molybdenum etchant.

16. The method for fabricating the array substrate of claim 13, wherein the metal barrier layer is formed such that a length of the first protrusion of the metal barrier layer is between 0.05 microns (μm) and 1.5 μm in a direction from the channel region toward the source electrode and/or the drain electrode; and the amorphous silicon layer is formed such that a length of the first sub-protrusion of the amorphous silicon layer is between 0 μm and 2 μm in the direction from the channel region toward the source electrode and/or the drain electrode.

17. The method for fabricating the array substrate of claim 13, wherein the ohmic contact layer and the amorphous silicon layer are formed such that at the end of the source electrode away from the channel region and/or at the end of the drain electrode away from the channel region, a sidewall of the second sub-protrusion of the ohmic contact layer is not flush with a sidewall of the first protrusion of the metal barrier layer, and a sidewall of the first sub-protrusion of the amorphous silicon layer is not flush with the sidewall of the second sub-protrusion of the ohmic contact layer.

\* \* \* \* \*